United States Patent
Kappler et al.

(10) Patent No.: US 12,268,285 B2
(45) Date of Patent: Apr. 8, 2025

(54) METHOD FOR PRODUCING CONTACT LENS PACKAGES

(71) Applicant: KOCH Pac-Systeme GmbH, Pfalzgrafenweiler (DE)

(72) Inventors: Karl Kappler, Pfalzgrafenweiler (DE); Juergen Bitzer, Pfalzgrafenweiler (DE); Benjamin Doelker, Pfalzgrafenweiler (DE)

(73) Assignee: KOCH PAC-SYSTEME GMBH, Pfalzgrafenweiler (DE)

( * ) Notice: Subject to any disclaimer, the term of this patent is extended or adjusted under 35 U.S.C. 154(b) by 81 days.

(21) Appl. No.: 17/740,546

(22) Filed: May 10, 2022

(65) Prior Publication Data
US 2023/0000226 A1    Jan. 5, 2023

(30) Foreign Application Priority Data
Apr. 15, 2021   (EP) ...................................... 21168571

(51) Int. Cl.
| B65B 25/00 | (2006.01) |
| A45C 11/00 | (2006.01) |
| B65B 7/28 | (2006.01) |
| B65B 9/04 | (2006.01) |
| B65B 47/02 | (2006.01) |
| B65B 55/22 | (2006.01) |
| C23C 16/40 | (2006.01) |
| C23C 16/50 | (2006.01) |

(52) U.S. Cl.
CPC .......... *A45C 11/005* (2013.01); *B65B 7/2842* (2013.01); *B65B 9/04* (2013.01); *B65B 25/008* (2013.01); *B65B 47/02* (2013.01); *B65B 55/22* (2013.01); *C23C 16/401* (2013.01); *C23C 16/50* (2013.01)

(58) Field of Classification Search
None
See application file for complete search history.

(56) References Cited

U.S. PATENT DOCUMENTS 5,620,088 A * 4/1997 Martin et al. ........ B65D 75/326
                                                           206/820
5,623,816 A * 4/1997 Edwards et al. ...... B29C 66/849
                                                           53/499
(Continued)

FOREIGN PATENT DOCUMENTS

EP    0354172 A1 *  2/1990  ............... B65B 9/04
EP    3461761 A1 *  4/2019  ........... B65D 75/327
(Continued)

OTHER PUBLICATIONS

European Search Report dated Sep. 30, 2021.

*Primary Examiner* — Stephen F. Gerrity
(74) *Attorney, Agent, or Firm* — Dickinson Wright PLLC

(57) ABSTRACT

The contact lens package comprises an accommodation element having a cup which contains a contact lens fluid and a contact lens, and a cover film which closes the cup. The accommodation element has, at least in a region of the cup, a coating containing silicon oxide or aluminium oxide. The associated method of production comprises the coating of the accommodation element, at least in the region of the cup, with the coating and the associated packaging machine comprises a coating station for corresponding coating of the accommodation element.

11 Claims, 2 Drawing Sheets

(56) References Cited

U.S. PATENT DOCUMENTS

| | | | | |
|---|---|---|---|---|
| 5,644,895 A | * | 7/1997 | Edwards et al. | B29C 66/8163 53/64 |
| 6,029,808 A | * | 2/2000 | Peck et al. | B65D 75/326 206/5.1 |
| 6,413,334 B1 | * | 7/2002 | Rittner et al. | B29C 66/8432 156/359 |
| 7,985,188 B2 | * | 7/2011 | Felts et al. | C23C 16/54 427/527 |
| 10,899,521 B2 | | 1/2021 | Swamy | |
| 2004/0238380 A1 | | 12/2004 | Newman | |
| 2012/0145569 A1 | * | 6/2012 | Chew | B32B 27/32 428/335 |
| 2015/0114851 A1 | * | 4/2015 | English et al. | B65D 75/326 53/431 |
| 2018/0134475 A1 | | 5/2018 | Newman | |
| 2018/0141692 A1 | * | 5/2018 | Hauck et al. | B29C 66/131 |
| 2019/0015561 A1 | * | 1/2019 | Wills et al. | C23C 16/515 |

FOREIGN PATENT DOCUMENTS

| | | | | |
|---|---|---|---|---|
| JP | H872808 A | | 3/1996 | |
| JP | H9216654 A | | 8/1997 | |
| JP | 2000238840 A | | 9/2000 | |
| JP | 4200203 B2 | * | 12/2008 | B65D 2585/545 |
| JP | 2018179568 A | | 11/2018 | |
| WO | 2009069265 A1 | | 4/2009 | |
| WO | WO-2011120715 A1 | * | 10/2011 | B29C 65/18 |
| WO | 2013153582 A1 | | 10/2013 | |

* cited by examiner

METHOD FOR PRODUCING CONTACT LENS PACKAGES

RELATED APPLICATIONS

The present disclosure claims priority to and the benefit of European Application 21 168 571.4, filed on Apr. 15, 2021 the entire contents of each of which are incorporated herein by reference.

FIELD

The present disclosure relates to a contact lens package and to a method and a packaging machine for producing same.

BACKGROUND

Contact lens packages generally comprise an accommodation element having at least one cup in which a contact lens fluid and a contact lens are contained, and a cover film which is firmly connected to the accommodation element in order to seal the at least one cup. The contact lens fluid is, for example, a saline solution which keeps the contact lens elastic, moist and sterile.

Diffusion of the contact lens fluid or constituents thereof out of the contact lens package would lead to a change in concentration of the remaining contact lens fluid in the contact lens package and thereby influence the shelf life of the packaged contact lens. In order to avoid this and ensure a sufficiently long shelf life of the packaged contact lens, contact lens packages must exhibit a sufficient barrier effect.

The barrier effect can, for example, be achieved by formation of the accommodation element from a multi-ply plastic film composite. However, such accommodation elements are costly and elaborate to produce and are only poorly recyclable.

Therefore, accommodation elements of contact lens packages are usually produced by means of injection moulding and have a relatively great wall thickness of, for example, from 0.8 mm to 1 mm in order to provide the necessary barrier effect. The material requirements and the resulting material costs are consequently enormous, especially when the number of units is very high.

BRIEF SUMMARY

It is an object of the present disclosure to provide a method and a packaging machine for producing contact lens packages, and contact lens packages which allow cost-effective production of contact lens packages having a sufficient barrier effect.

According to an aspect of the disclosure, a method for producing contact lens packages comprises the steps of:
  forming an accommodation element having at least one cup;
  coating the accommodation element, at least in a region of the at least one cup, with a coating containing silicon oxide or aluminium oxide;
  filling the at least one cup with a contact lens fluid and a contact lens; and
  applying a cover film to the accommodation element to close the at least one cup.

What is produced in this way is a contact lens package having, at least in the region of the cup accommodating the contact lens fluid, a coating containing silicon oxide or aluminium oxide. The coating is configured to seal off the accommodation element in the region of the cup. The silicon oxide- or aluminium oxide-containing coating has excellent barrier properties that greatly reduce or even eliminate diffusion of the contact lens fluid or constituents thereof. As a result, the wall thickness of the contact lens package can be distinctly reduced, for example to about a third of the wall thickness of conventional contact lens packages, thereby making it possible to drastically reduce the material requirements and thus the costs. Compared to a multi-ply plastic film composite, the contact lens packages are also better recyclable. Moreover, both the reduced material requirements and the better recyclability are environmentally advantageous.

The silicon oxide can, in particular, comprise silicon monoxide or silicon dioxide. In a preferred embodiment, the coating solely consists of silicon oxide, in particular silicon dioxide. At the very least, the silicon oxide forms a major constituent of the coating in order to provide the necessary barrier effect of the coating.

The aluminium oxide can, in particular, comprise $Al_2O_3$. In a preferred embodiment, the coating solely consists of aluminium oxide. At the very least, the aluminium oxide forms a major constituent of the coating in order to provide the necessary barrier effect of the coating.

The contact lens fluid is preferably a saline solution comprising water and sodium chloride. However, the contact lens fluid can also be a different known contact lens fluid.

Preferably, the herein described method steps of all the embodiments are, in each case, carried out in the order specified. Regardless of this, all the herein described method steps are preferably executed automatically, i.e. by machine. For example, the forming of the accommodation element is effected by means of a forming station of a packaging machine, the coating of the accommodation element is effected by means of a coating station of said packaging machine, the filling of the cup is effected by means of a filling station of said packaging machine, and applying the cover film is effected by means of a sealing station of said packaging machine.

The efficiency of the method can be increased by respectively executing the method for a plurality of accommodation elements. Instead of the one accommodation element, there is then the respective occurrence of the plurality of accommodation elements, which includes the one accommodation element. To this end, each method step can be executed simultaneously for the plurality of accommodation elements. The method steps can also be repeated for each accommodation element or for respectively a plurality of accommodation elements. This applies to all the herein described embodiments of the method.

Regardless of this, the accommodation element can have a plurality of cups. For example, the accommodation element has two cups, one of which can contain a contact lens for the left eye and the other of which can contain a contact lens for the right eye. The accommodation element can also have more than two cups which, for example, can each contain a contact lens of the same strength.

The coating of the accommodation element in the region of the at least one cup comprises the coating of at least the cup inner surface. The cup inner surface is the side of the cup that, together with the cover film, forms a cavity in which the contact lens fluid and the contact lens are accommodated. The cup inner surface is therefore in contact with the contact lens fluid. Preferably, the cup inner surface of the at least one cup is completely coated with the coating.

The accommodation element comprises, moreover, a flange which surrounds the at least one cup. The application of the cover film preferably comprises the attachment of the cover film to the flange, especially the (heat) sealing or adhesive bonding of the cover film to the flange. As a result, the cover film can be completely sealingly connected to the accommodation element around the at least one cup.

It may be desirable for regions outside the cup, and especially the region of the flange in which the cover film is applied, not to be coated so as to allow simpler and better connection of the cover film to the accommodation element. The coating of the accommodation element is then preferably effected solely in the region of the cup, especially solely on the cup inner surface.

Whereas accommodation elements of contact lens packages have hitherto usually been formed by means of injection moulding because of the great wall thickness, it is now possible for the first time through the method according to the disclosure and the thereby realizable lower wall thickness to produce accommodation elements of contact lens packages by thermoforming from a preferably single-ply film web.

In a preferred embodiment, the formation of the accommodation element therefore comprises the following steps:
  providing a film web; and
  thermoforming the at least one cup into the film web.

The thermoforming preferably comprises the heating of the film web and the deep drawing of the at least one cup in the heated film web. The deep drawing can be effected by means of a forming device and/or compressed air or vacuum. The forming device can comprise a punch and a die and, if desired, be supported by the use of compressed air or vacuum. The forming device can also comprise only a die, into which the film web is formed by means of compressed air or vacuum.

The use of the silicon oxide- or aluminium oxide-containing coating means that the accommodation element of the contact lens package can be formed from a comparatively thin film. It is preferred that the accommodation element has, at least in the region of the at least one cup, a wall thickness which is between 0.05 mm and 0.6 mm, more preferably between 0.1 mm and 0.5 mm and even more preferably between 0.2 mm and 0.4 mm.

In the case of thermoforming, the film web preferably has a thickness which is between 0.05 mm and 0.6 mm, more preferably between 0.1 mm and 0.5 mm and even more preferably between 0.2 mm and 0.4 mm.

The accommodation element and thus the film web possibly used is preferably formed from a plastic selected from the group of the polyolefins or the polyhalogen olefins or from a combination thereof. Particularly preferably, the plastic is selected from a group comprising: polypropylene (PP), polyvinyl chloride (PVC), polyethylene (PE), polyamide (PA) or polyethylene terephthalate (PET). Preferably, the accommodation element and thus the film web possibly used solely comprises a layer of the particular plastic and, in particular, does not comprise composite material or a multi-ply structure of different materials.

Preferably, the formation of the accommodation element additionally comprises the punching of the accommodation element out of the film web before the coating of the accommodation element. This can ensure that the coating is not damaged or destroyed during punching. However, it is also conceivable that the method comprises the punching of the accommodation element out of the film web after the coating of the accommodation element.

The punching is preferably effected by means of a punching device. Upon punching, the accommodation element is completely separated from the film web. However, it is also conceivable to punch out a plurality of accommodation elements joined together or integral with one another.

In order to make the method as efficient as possible and to facilitate coating, the method preferably additionally comprises, before the coating of the accommodation element, the steps of:
  grasping the accommodation element by means of a handling device; and
  inserting the grasped accommodation element into a support by means of the handling device.

This has the advantage that multiple accommodation elements continue to be processed in singularized form and not in bulk, which might lead to damage of accommodation elements if they have a wall thickness of, for example, 0.3 mm. Moreover, the transfer of the accommodation elements for coating can thereby take place automatically. The support can preferably accommodate a plurality of accommodation elements.

In the case of thermoforming, the grasping and insertion of the accommodation element preferably takes place after punching. In particular, the accommodation elements can then be grasped in the punching device by means of the handling device and removed from the punching device.

The handling device can be designed as a gripping device or as a suction device. Relevant devices are also known to a person skilled in the art as "pick-and-place" devices.

Suitable general conditions for coating of the accommodation element can be created if the method additionally comprises, before the coating of the accommodation element, the arrangement of the accommodation element in a coating chamber, and the coating of the accommodation element is effected in the coating chamber. In the coating chamber, the general conditions, such as, for example, pressure and the atmosphere surrounding the accommodation element, can be influenced and set particularly easily.

For movement of the accommodation element into the coating chamber, the coating chamber can preferably be opened and closed. For example, the coating chamber has for this purpose at least one, preferably two closable openings, through which the accommodation element can be moved into the coating chamber and out of the coating chamber. It is also conceivable that part of the coating chamber is movable and is, for example, moved over the accommodation element.

The arrangement of the accommodation element in the coating chamber preferably comprises the movement of the support, into which the accommodation element has been inserted, into the coating chamber. Preferably, a plurality of accommodation elements has been inserted into the support.

The coating of the accommodation element or generation of the coating can be effected by means of physical vapour deposition.

The coating of the accommodation element or generation of the coating can, however, also be effected by means of chemical vapour deposition. In one embodiment, the coating of the accommodation element or generation of the coating is preferably effected by the PECVD method (plasma enhanced chemical vapour deposition) or the PICVD method (plasma impulse chemical vapour deposition). These methods have the advantage that they allow the formation of very thin and very uniform coatings of high quality, even on curved substrates, such as the accommodation element having the at least one cup. For details about the PECVD method and the PICVD method, reference is made by way of example to "Unger, E. (1991), *Die Erzeugung dünner Schichten. Das PECVD-Verfahren: Gasphasenabscheidung in einem Plasma* [Generating thin layers. The PECVD method: vapour deposition in a plasma], in *Chemie in unserer Zeit* [Modern chemistry], volume 25, issue 3" and "Bach et al. (2003), Thin Films on Glass, Germany, Springer Berlin Heidelberg".

The method preferably additionally comprises, after the arrangement of the accommodation element in the coating chamber and before the coating of the accommodation element, the steps of:

generating a subatmospheric pressure in the coating chamber; and introducing a process gas into the coating chamber.

The subatmospheric pressure is preferably between $1*10^{-2}$ and $1*10^{-8}$ mbar, more preferably between $2*10^{-4}$ and $1*10^{-7}$ mbar and even more preferably between $2*10^{-5}$ and $1*10^{-6}$ mbar.

The process gas preferably contains oxygen and a silicon- or aluminium-containing gas. The process gas can, for example, comprise monosilane $SiH_4$, nitric oxide NO and/or tetraethyl orthosilicate $Si(OC_2H_5)_4$.

The coating of the accommodation element then preferably comprises the generation of a plasma in the coating chamber and, as a result, the generation of the coating. The plasma can be generated in the coating chamber with supply of energy by means of microwave radiation or by means of electrodes.

An exemplary reaction which can take place for generation of a silicon oxide-containing coating is

$$SiH_4 + 4NO \rightarrow SiO_2 + 2H_2O + 2N_2$$

wherein $SiH_4$ and NO are supplied in gaseous form and silicon dioxide $SiO_2$ is formed.

Just a very thin silicon oxide- or aluminium oxide-containing coating is sufficient to achieve the necessary barrier effect. Preferably, the coating has a layer thickness which is between 2 nm and 500 nm, more preferably between 10 nm and 250 nm and even more preferably between 20 nm and 80 nm. In a particularly preferred embodiment, the layer thickness of the coating is between 40 nm and 60 nm or between 45 nm and 55 nm. Coatings of such a thickness can be generated easily using the stated methods.

Preferably, the accommodation element is accommodated in the support during coating. As described above, the accommodation element was preferably moved into the coating chamber by means of the support. In order to make the method as efficient as possible, it is additionally preferred that the filling of the at least one cup of the accommodation element comprises the movement of the support through a filling station and that the application of the cover film to the accommodation element comprises the movement of the support through a sealing station. This means that the accommodation element in the support is moved through further processing stations without the need for handling or transfer of the delicate accommodation elements. Moreover, this means that at no time in the method are the accommodation elements arranged in bulk, thus eliminating the elaborate step of singularization of the accommodation elements before filling and closing the accommodation elements, which step is usually necessary in the case of injection-moulded accommodation elements.

If the accommodation element has a plurality of cups and/or if multiple accommodation elements are connected to one another, it may be desirable to be able to detach individual cups or accommodation elements. If the cover film has been applied to the accommodation element, the method can then additionally comprise the introduction of a material weakening, in particular a perforation or groove, between the individual cups of an accommodation element or the individual accommodation elements.

Altogether, a very efficient method for producing cost-effective contact lens packages is therefore provided.

According to an aspect of the disclosure, a contact lens package comprises an accommodation element which has at least one cup for accommodation of a contact lens fluid and a contact lens, and a cover film which is connected to the accommodation element in order to close the at least one cup. The accommodation element has, at least in the region of the at least one cup, a coating containing silicon oxide or aluminium oxide.

What is provided in this way is a contact lens package having, at least in the region of the cup accommodating the contact lens fluid, a coating containing silicon oxide or aluminum oxide. The coating is configured to seal off the accommodation element in the region of the cup. The silicon oxide- or aluminium oxide-containing coating has excellent barrier properties that greatly reduce or even eliminate diffusion of the contact lens fluid or constituents thereof. As a result, the wall thickness of the contact lens package can be distinctly reduced, for example to about a third of the wall thickness of conventional contact lens packages, thereby making it possible to drastically reduce the material requirements and thus the costs. Compared to a multi-ply plastic film composite, the contact lens packages are also better recyclable. Both the reduced material requirements and the better recyclability are environmentally advantageous.

The contact lens package is preferably produced by means of the above-described method.

All the features which have been described with regard to the contact lens package and, in particular, the coating in connection with the method are analogously applicable to the contact lens package and vice versa.

The at least one cup contains the contact lens fluid and a contact lens. The contact lens fluid is preferably a saline solution comprising water and sodium chloride. However, the contact lens fluid can also be a different known contact lens fluid.

The contact lens package can also comprise a plurality of inter-connected accommodation elements.

The accommodation element can have a plurality of cups. For example, the accommodation element has two cups, one of which can contain a contact lens for the left eye and the other of which can contain a contact lens for the right eye. The accommodation element can also have two or more cups which, for example, can each contain a contact lens of the same strength.

The at least one cup preferably has a diameter which is between 5 mm and 35 mm, more preferably between 18 mm and 28 mm and even more preferably between 20 mm and 22 mm.

A depth of the at least one cup is preferably between 1 mm and 15 mm, more preferably between 3 mm and 10 mm and even more preferably between 5 mm and 6 mm.

Preferably, at least one cup inner surface of the at least one cup has the coating. The cup inner surface is the side of the cup that, together with the cover film, forms a cavity in which the contact lens fluid and the contact lens are accommodated. The cup inner surface is therefore in contact with the contact lens fluid. Preferably, the cup inner surface is completely coated with the coating.

The accommodation element comprises, moreover, the flange which surrounds the at least one cup. The cover film is preferably attached to the flange, especially (heat) sealed or adhesively bonded to the flange. Ideally, the cover film is completely sealingly connected to the accommodation element around the at least one cup.

It is conceivable that regions outside the cup, and especially the region of the flange in which the cover film is applied, do not have a coating. This can allow simpler and better connection of the cover film to the accommodation element. Preferably, it is then solely the region of the cup, especially solely the cup inner surface, that has the coating.

In order to ensure a sufficient seal of the contact lens package and to allow simple connection of the cover film to the accommodation element and simple opening of the contact lens package by removal of the cover film, the cover film can be formed by an aluminium composite film. For example, such a composite film comprises a layer of polypropylene PP, a layer of aluminium and a layer of polyethylene PE. Regardless of the structure of the cover film and of these materials, it is also conceivable that the cover film has a coating containing silicon oxide or aluminium oxide. In particular, a side of the cover film that is facing the at least one cup then has the coating. Apart from that, reference is made to the remarks concerning coating the accommodation element that apply analogously.

Great material savings can be achieved if the accommodation element preferably has, in the region of the at least one cup, a wall thickness which is between 0.05 mm and 0.6 mm, more preferably between 0.1 mm and 0.5 mm and even more preferably between 0.2 mm and 0.4 mm.

The accommodation element is preferably formed from a plastic selected from the group of the polyolefins or the polyhalogen olefins or from a combination thereof. Particularly preferably, the plastic is selected from a group comprising: polypropylene (PP), polyvinyl chloride (PVC), polyethylene (PE), polyamide (PA) or polyethylene terephthalate (PET).

Preferably, the coating has a layer thickness which is between 2 nm and 500 nm, more preferably between 10 nm and 250 nm and even more preferably between 20 nm and 80 nm. In a particularly preferred embodiment, the layer thickness of the coating is between 40 nm and 60 nm or between 45 nm and 55 nm. Coatings of such a thickness can be generated easily using the methods described herein.

According to an aspect of the disclosure, a packaging machine for producing contact lens packages comprises:
- a forming station configured to form at least one cup in an accommodation element;
- a coating station configured to coat the accommodation element, at least in the region of the at least one cup, with a coating containing silicon oxide or aluminium oxide;
- a filling station configured to fill the at least one cup of the accommodation element with a contact lens fluid and a contact lens; and
- a sealing station configured to apply a cover film to the accommodation element to close the at least one cup.

What is provided in this way is a packaging machine, by means of which it is possible to provide the at least one cup of the accommodation element of the contact lens package with a silicon oxide- or aluminium oxide-containing coating and, as a result, to achieve the advantages already described in relation to the method according to the disclosure and the contact lens package according to the disclosure.

Preferably, the packaging machine is configured to execute the method described above. Preferably, the packaging machine is configured to produce contact lens packages described above.

The features which have been described with regard to the method or the contact lens package are analogously applicable to the packaging machine and vice versa.

The packaging machine can additionally comprise a punching station which is configured to punch out the accommodation element. In particular, the forming station can be configured for thermoforming the at least one cup into a film web and the punching station can be configured for punching the accommodation element out of the film web.

After the sealing station, the packaging machine can comprise a further station, such as, for example, a perforating or grooving station, which is configured to introduce a material weakening between individual cups of a plurality of cups of an accommodation element and/or between individual accommodation elements of a plurality of interconnected accommodation elements. The material weakening can, for example, be in the form of a perforation or groove and allow detachment of a cup or an accommodation element.

The forming station preferably comprises a heating device for heating of the film web and a forming device for forming of the at least one cup into the film web, as already described in connection with the method above.

The coating station preferably comprises the coating chamber in which the accommodation element is coated with the silicon oxide- or aluminium oxide-containing coating. The coating chamber can have a gas feed for introduction of the process gas into the coating chamber. The coating chamber can be fluidically connected to a vacuum source for generation of a subatmospheric pressure in the coating chamber. In addition, the coating station preferably comprises an energy source which is configured to generate the plasma in the coating chamber. The energy source can be configured for generation of microwaves in the coating chamber or comprise electrodes.

Preferably, the coating station is integrated in the packaging machine such that the support, into which at least one accommodation element has been inserted, can automatically pass through the coating station, the filling station and the sealing station.

DETAILED DESCRIPTION

Figure 1:
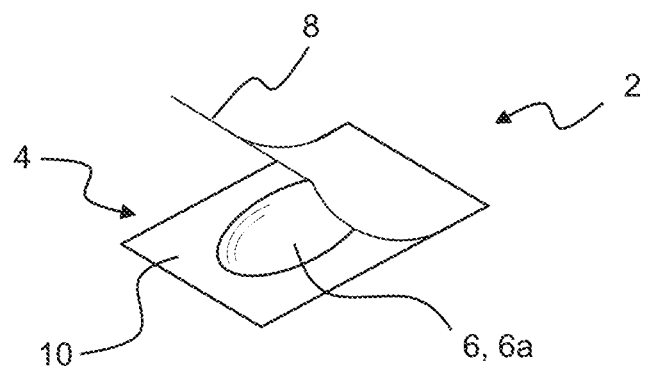
FIG. 1 shows a perspective view of a contact lens package according to the disclosure.

FIG. 1 depicts a perspective view of an embodiment of a contact lens package 2 according to an aspect of the disclosure. A cross-sectional view of the contact lens package 2 can be seen in FIG. 2*d*. The contact lens package 2 comprises an accommodation element 4 which has at least one cup 6, and a cover film 8 which is connected to the accommodation element 4 in order to seal the at least one cup 6. Moreover, the accommodation element 4 has a flange 10 which surrounds the at least one cup 6 and to which the cover film 8 is attached.

Preferably, the accommodation element 4 has exactly one cup 6. It is possible for multiple accommodation elements 4 to be connected to one another, for example along their longitudinal and/or transverse sides. Preferably, the accommodation elements 4 are connected to one another such that they are as easily separable as possible, for example by means of a perforated region of the accommodation element 4 and the cover film 8. The accommodation element 4 can also have a plurality of cups 6. The description of preferred embodiments herein therefore applies analogously to embodiments having a plurality of accommodation elements 4 and/or a plurality of cups 6, essentially irrespective of the number of accommodation elements 4 and cups 6.

Figures 2A, 2B:
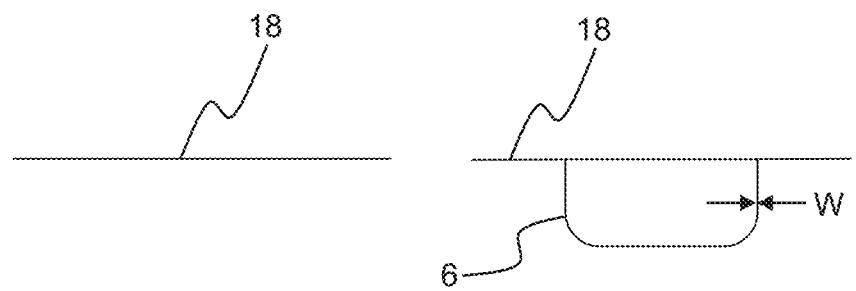
FIG. 2*a-d* show a side view of a contact lens package and corresponding intermediate products during a method according to the disclosure.
Figures 2C, 2D:
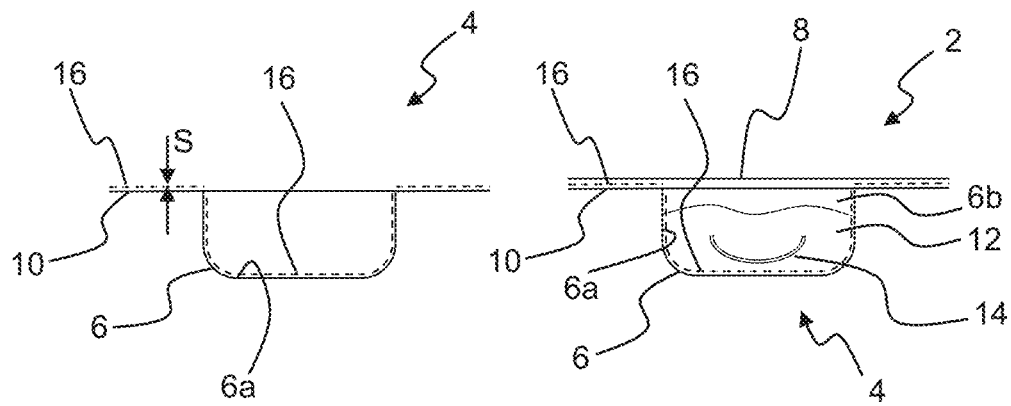

The at least one cup 6 serves to accommodate a contact lens fluid 12 and a contact lens 14, as can be seen in the cross-sectional view according to FIG. 2*d*. In order to avoid diffusion of the contact lens fluid 12 or constituents thereof out of the contact lens package 2, even in the case of a low wall thickness of the accommodation element 4 in the region of the cup 6, the accommodation element 4 has, at least in the region of the cup 6, a coating 16 containing silicon oxide or aluminium oxide. The coating 16 is indicated by a dashed line in FIGS. 2*c* and 2*d*. It is self-evident that the coating 16 is preferably continuous.

Preferably, at least one cup inner surface 6*a* has the coating 16. The cup inner surface 6*a* is the side of the cup 6 that, together with the cover film 8, forms a cavity 6*b* in which the contact lens fluid 12 and the contact lens 14 are accommodated. The cup inner surface 6*a* is therefore in contact with the contact lens fluid 12 and should therefore be completely provided with the coating 16 in order to provide the necessary barrier effect.

The accommodation element 4 can also have the coating 16 in the region outside the cup 6 and especially in the region of the flange 10, as shown in FIGS. 2*c* and 2*d*. However, it may also be desirable for the accommodation element 4 not to have a coating 16 outside the cup 6 or cup inner surface 6*a* and especially in the region of the flange 10, for example for better attachment of the cover film 8 to the accommodation element 4.

The sealing effect of the coating 16 means that the wall thickness of the accommodation element 4 can be minimized, while the seal of the contact lens package 2 is ensured at the same time. The accommodation element 4 can therefore have, in the region of the cup 6 and preferably everywhere, a wall thickness W which is between 0.05 mm and 0.6 mm, more preferably between 0.1 mm and 0.5 mm and even more preferably between 0.2 mm and 0.4 mm.

The coating 16 preferably has a layer thickness S which is between 2 nm and 500 nm, more preferably between 10 nm and 250 nm and even more preferably between 20 nm and 80 nm. In a particularly preferred embodiment, the layer thickness S of the coating 16 is between 40 nm and 60 nm or between 45 nm and 55 nm. The coating 16 preferably has a uniform layer thickness S, especially on the cup inner surface 6*a*.

An embodiment of the method according to an aspect of the disclosure for producing the contact lens package 2 is described below.

The method first comprises the formation of the accommodation element 4 which has the at least one cup 6. In order to be able to produce a plurality of contact lens packages 2, the method steps can be repeated for each contact lens package 2 or each method step is carried out simultaneously for a plurality of accommodation elements 4 and, if necessary, subsequently repeated for a further plurality of accommodation elements 4. It is self-evident that the following remarks always apply to at least one accommodation element 4 and thus not only to one accommodation element 4 but also to a plurality of accommodation elements 4 which are produced in parallel or consecutively.

The accommodation element 4 can, in principle, be formed by means of injection moulding or by thermoforming. If the accommodation element 4 is produced by injection moulding, this already gives it the desired shape having the at least one cup 6, as can be seen in FIG. 2*b* for example.

However, preference is given to the formation of the accommodation element 4 by thermoforming. As depicted in FIGS. 2*a* and 2*b*, the formation of the accommodation element 4 can comprise the provision of a film web 18 and the thermoforming of the at least one cup 6 into the film web 18. The thermoforming, in turn, comprises the heating of the film web 18 and the deep drawing of the at least one cup 16 in the film web 18. The film web 18 can, for example, consist of polypropylene (PP) and have a thickness which substantially corresponds to the wall thickness W of the accommodation element 4 to be formed, in particular the cup 16. The method has maximum efficiency when a plurality of cups 6 is formed into the film web 18 at the same time.

After the at least one cup 6 has been formed in the film web 18, the formation of the accommodation element 4 preferably comprises punching the accommodation element 4 out of the film web 18. Singularized accommodation elements 4 are present after punching. At the same time, each accommodation element 4 can have one or more cups 6. It is also conceivable that a plurality of inter-connected accommodation elements 4 is punched out.

The method additionally comprises coating the accommodation element 4, at least in the region of the cup 6, with the coating 16 containing silicon oxide or aluminium oxide. A correspondingly coated accommodation element 4 can be seen in FIG. 2*c*, the coating 16 being indicated by a dashed line. Coating the accommodation element 4 is effected at least on the cup inner surface 6*a*, so that the accommodation element 4 has the coating 16 at least on the cup inner surface 6*a*, as described above. Coating can also be effected in the region outside the cup 6 and especially in the region of the flange 10, as can be seen in FIG. 2*c*, or solely on the cup inner surface 6*a*.

In order to facilitate the handling of the delicate accommodation elements 4 throughout the remainder of the method, to protect them from damage and to make the method as efficient as possible, the method preferably comprises the grasping of the accommodation element 4 by means of a handling device and the insertion of the grasped accommodation element 4 into a support 20 by means of the handling device. The handling device can directly remove the accommodation element 4 from a punching device preferably after punching.

Suitable handling devices are known to a person skilled in the art, for example as "pick-and-place" devices, and therefore not described in detail. For example, the handling device can be designed as a gripping device or suction device for grasping of respectively one or more accommodation elements 4.

Figure 3:
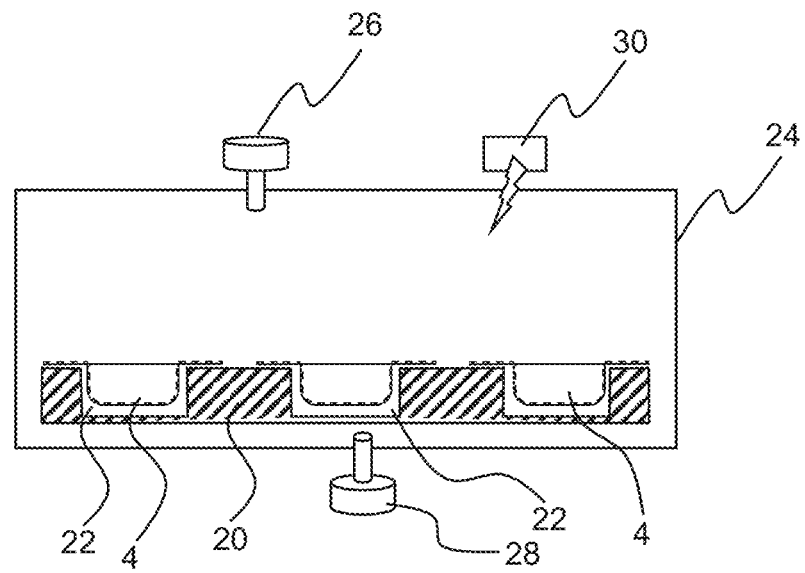
FIG. 3 schematically shows a coating chamber for coating of contact lens packages.

In the support 20, which is depicted schematically in FIG. 3, the accommodation element 4 can be fed to the further processing steps. Preferably, the support 20 accommodates a plurality of accommodation elements 4 at the same time. The support 20 comprises a seat 22, for example in the form of a receptacle or a through-bore, for each accommodation element 4 to be accommodated or for each cup 16 to be accommodated. At the same time, the accommodation element 4 can be arranged in the support 20 such that the flange 10 rests on the support 20 and the at least one cup 6 is open to the top, as depicted in FIG. 3. However, the accommodation element 4 can also be arranged on the support 20 such that the flange 10 rests on the support 20 and the at least one cup 6 is open to the bottom. The seat 22 is then preferably adapted to the flange 10 and open to the bottom, so that the cup inner surface 6a is accessible for coating. As a result, the accommodation element 4 rests on the support 20 via the regions of the flange 10 that are adjacent to the cup 6, and coating of said regions of the flange 10 can be prevented.

Coating is preferably effected in a coating chamber 24, which is depicted schematically in FIG. 3. In this case, the method comprises, before the coating of the accommodation element 4, the arrangement of the accommodation element 4 in the coating chamber 24 and subsequently the coating of the accommodation element 4 in the coating chamber 24. The arrangement of the accommodation element 4 in the coating chamber 24 is preferably effected by moving the support 20 into the coating chamber 24.

After the arrangement of the accommodation element 4 in the coating chamber 24 and before the coating of the accommodation element 4, the method preferably comprises the generation of a subatmospheric pressure in the coating chamber 24 and the introduction of a process gas into the coating chamber 24.

For this purpose, the coating chamber 24 can have a gas feed 26 for introduction of the process gas into the coating chamber 24. The gas feed 26 is closable and provides a fluid connection to a gas tank. Furthermore, the coating chamber 24 is in fluid connection with a vacuum source 28 for generation of the subatmospheric pressure in the coating chamber 24.

Furthermore, the method comprises the generation of a plasma in the coating chamber and, as a result, the generation of the coating 16 on the accommodation element 4. For generation of a plasma from the process gas, the coating chamber 24 has a suitable energy source 30. The energy source 30 is, for example, configured for generation of microwaves or comprises suitable electrodes.

If the accommodation element 4 has been coated with the coating 16, it is supplied to the further method steps, preferably by being guided in the support 20 through relevant processing stations.

What takes place first after coating is the filling of the at least one cup 6 of the accommodation element 4 with the contact lens fluid 12 and the contact lens 14, both of which can be seen in FIG. 2d. The filling of the at least one cup 6 of the accommodation element 4 preferably comprises moving the support 20 through a filling station.

If the at least one cup 6 has been filled, what takes place is the application of the cover film 8 to the accommodation element 4 to close the at least one cup 6, as likewise depicted in FIG. 2d. The application of the cover film 8 preferably comprises the adhesive bonding or (heat) sealing of the cover film 8 to the accommodation element 4, especially in the region of the flange 10. Moreover, the application of the cover film 8 can comprise the movement of the support 20 through a sealing station.

So that the cover film 8 also provides a sufficient barrier effect, it is preferably formed from an aluminium composite film. Such cover films are known to a person skilled in the art and can be connected to the accommodation element 4 in a simple manner and, at the same, easily opened for removal of the contact lens 14.

If the accommodation element 4 has a plurality of cups 6 and/or if multiple accommodation elements 4 are connected to one another, it may be desirable to be able to detach individual cups 6 or accommodation elements 4. If the cover film 8 has been applied to the accommodation element 4, the method can then additionally comprise the introduction of a material weakening, in particular a perforation or groove, between the individual cups 6 of an accommodation element 4 or between the individual accommodation elements 4.

Figure 4:
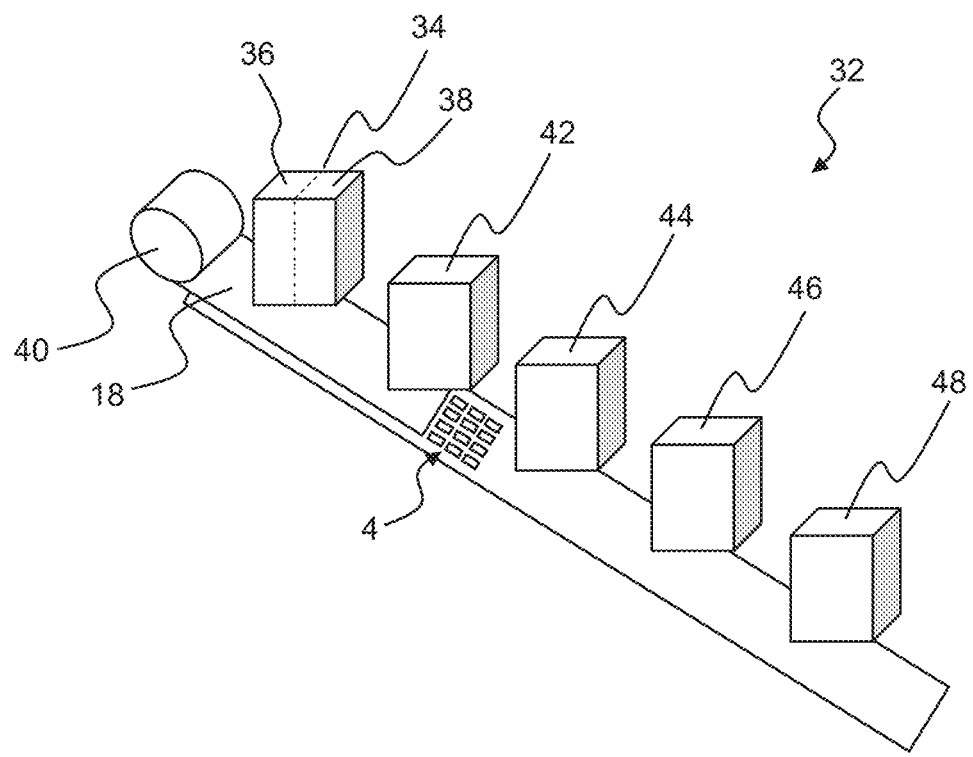
FIG. 4 schematically shows a perspective view of a packaging machine according to the disclosure.

Referring to FIG. 4, what is described is a packaging machine 32 according to an aspect of the disclosure for producing the contact lens packages 2, which packaging machine is configured to execute the method described above and to produce contact lens packages 2 described above.

The packaging machine 32 comprises a forming station 34 which is configured to form the at least one cup 6 of the accommodation element 4. In the preferred exemplary embodiment in which the accommodation element 4 is formed by thermoforming, the forming station 34 comprises a heating device 36 for heating of the film web 18 and a forming device 38 for forming or deep drawing of the at least one cup 6 into the film web 18. The heating device 36 and the forming device 38 are indicated schematically in FIG. 4 as components of the forming station 34. Preferably, a plurality of cups 6 is formed at the same time.

The efficiency of formation of the at least one cup 6 by thermoforming can be taken advantage of particularly effectively if the film web 18 is provided on a stock roll 40. The long-length film web 18 can be kept in reserve in a space-saving manner on the stock roll 40. Moreover, the film web 18 can be easily fed to the forming station 34.

In this exemplary embodiment, the packaging machine 32 further comprises an optional punching station 42 for punching of the accommodation element 4 out of the film web 18. Preferably, a plurality of accommodation elements 4 is punched out at the same time. Preferably, the punching by the punching station 42 is effected immediately after the forming of the at least one cup 6 in the forming station 34. The accommodation elements 4 are thereby punched before coating, so that the intactness of the coating 16 can be ensured. However, it is also conceivable to punch the accommodation elements 4 only after coating. The punching station 42 would then have to be arranged at an appropriate point in the packaging machine 32.

Suitable forming and punching stations 34, 42 are known to a person skilled in the art in the field of package production and therefore not described in detail.

After punching, the accommodation elements 4 are present in singularized form, but can still have multiple cups 6. For gentle handling, the accommodation elements 4 are then preferably inserted into a support 20 (see FIG. 3) by means of the handling device and fed to the further processing stations.

The packaging machine 32 additionally comprises a coating station 44 which is configured for coating of the accommodation element 4, at least in the region of the at least one cup 6, with the coating 16 containing silicon oxide or aluminium oxide. The coating station 44 can comprise the coating chamber 24 and the energy source 30, as have been described in detail with reference to FIG. 3.

It is particularly preferred that the coating station 44 is integrated in the packaging line, the result being that the contact lens packages 2 are producible in a particularly simple and efficient manner. In particular, the accommodation elements 4 can then be guided in the support 20 through both the coating station 44 and subsequent processing stations without the need for further handling or for transfer of the accommodation elements 4. However, this does not mean that the coating station 44 must be arranged and oriented in a line with the other processing stations. For example, it is conceivable that the accommodation elements 4 are moved away from the other processing stations and towards the coating station 44 by means of the handling device, which is, for example, attached to a robot. It is also conceivable that the accommodation elements 4 are first inserted into the support 20 and the support 20 is accordingly guided or moved by means of a robot to the coating station 44.

In a filling station 46 of the packaging machine 32, the contact lens fluid 12 and the contact lens 14 are filled into each cup 6. Afterwards, the packaging machine 32 additionally comprises a sealing station 48 which is configured to apply the cover film 8 to the accommodation element 4. The filling station 46 and the sealing station 48 can be configured for production of contact lens packages in accordance with known packaging machines and are therefore not described in detail.

If multiple cups 6 are present in an accommodation element 4 or multiple accommodation elements 4 are integral with one another, material weakenings, in particular perforations or grooves, can be introduced between individual cups 6 of an accommodation element 4 or between the individual accommodation elements 4 in a station (not depicted) which follows the sealing station 48. Material weakenings other than perforations are possible, too.

The invention claimed is:

1. A method for producing contact lens packages, comprising the steps of:
    forming an accommodation element having at least one cup;
    coating the accommodation element, at least in a region of the at least one cup, with a coating solely consisting of silicon oxide or aluminium oxide;
    filling the at least one cup of the accommodation element with a contact lens fluid and a contact lens; and
    applying a cover film to the accommodation element to close the at least one cup.

2. The method of claim 1, wherein the step of forming the accommodation element comprises the steps of:
    providing a film web; and
    thermoforming the at least one cup into the film web.

3. The method of claim 2, wherein the step of forming the accommodation element additionally comprises punching the accommodation element out of the film web before the step of coating the accommodation element.

4. The method of claim 1, wherein the accommodation element has, in the region of the at least one cup, a wall thickness which is between 0.05 mm and 0.6 mm.

5. The method of claim 1, wherein the method additionally comprises, before the step of coating the accommodation element, the steps of:
    grasping the accommodation element by means of a handling device; and
    inserting the grasped accommodation element into a support by means of the handling device.

6. The method of claim 5, wherein
    the step of filling the at least one cup of the accommodation element comprises moving the support through a filling station; and
    the step of applying the cover film to the accommodation element comprises moving the support through a sealing station.

7. The method of claim 1, wherein the method additionally comprises, before the step of coating the accommodation element, arranging the accommodation element in a coating chamber, and the coating of the accommodation element is effected in the coating chamber.

8. The method of claim 7, wherein the method additionally comprises, after the step of arranging the accommodation element in the coating chamber and before the step of coating the accommodation element, the steps of:
    generating a subatmospheric pressure in the coating chamber; and
    introducing a process gas into the coating chamber.

9. The method of claim 8, wherein the step of coating the accommodation element comprises:
    generating a plasma in the coating chamber and, as a result, generating the coating.

10. The method of claim 1, wherein the coating has a layer thickness which is between 10 nm and 250 nm.

11. The method of claim 1, wherein the coating has a layer thickness which is between 20 nm and 80 nm.

* * * * *